(12) United States Patent
Mesuda et al.

(10) Patent No.: US 11,802,049 B2
(45) Date of Patent: Oct. 31, 2023

(54) GALLIUM NITRIDE-BASED SINTERED COMPACT AND METHOD FOR MANUFACTURING SAME

(71) Applicant: TOSOH CORPORATION, Shunan (JP)

(72) Inventors: Masami Mesuda, Ayase (JP); Hideto Kuramochi, Ayase (JP)

(73) Assignee: TOSOH CORPORATION, Shunan (JP)

( * ) Notice: Subject to any disclaimer, the term of this patent is extended or adjusted under 35 U.S.C. 154(b) by 0 days.

(21) Appl. No.: 17/590,120

(22) Filed: Feb. 1, 2022

(65) Prior Publication Data

US 2022/0153582 A1    May 19, 2022

Related U.S. Application Data

(63) Continuation of application No. 15/562,112, filed as application No. PCT/JP2016/059341 on Mar. 24, 2016, now abandoned.

(30) Foreign Application Priority Data

| Mar. 30, 2015 | (JP) | 2015-069913 |
| Apr. 24, 2015 | (JP) | 2015-089571 |
| Jul. 30, 2015 | (JP) | 2015-150959 |
| Jul. 31, 2015 | (JP) | 2015-152855 |

(51) Int. Cl.
| C01B 21/06 | (2006.01) |
| C23C 14/34 | (2006.01) |
| C30B 29/38 | (2006.01) |
| C04B 35/58 | (2006.01) |
| C23C 14/06 | (2006.01) |
| C30B 23/02 | (2006.01) |
| C30B 25/20 | (2006.01) |
| C30B 29/40 | (2006.01) |
| C30B 29/68 | (2006.01) |
| H01J 37/34 | (2006.01) |

(52) U.S. Cl.
CPC .......... *C01B 21/0632* (2013.01); *C04B 35/58* (2013.01); *C23C 14/0641* (2013.01); *C23C 14/34* (2013.01); *C23C 14/3414* (2013.01); *C30B 23/025* (2013.01); *C30B 25/20* (2013.01); *C30B 29/38* (2013.01); *C30B 29/406* (2013.01); *C30B 29/68* (2013.01); *H01J 37/3426* (2013.01); *C01P 2006/10* (2013.01); *C01P 2006/40* (2013.01); *C01P 2006/80* (2013.01)

(58) Field of Classification Search
None
See application file for complete search history.

(56) References Cited

U.S. PATENT DOCUMENTS

| 5,360,697 A | 11/1994 | Mehra |
| 7,259,409 B2 | 8/2007 | Koinuma et al. |
| 2003/0086856 A1 | 5/2003 | D'Evelyn et al. |
| 2006/0163605 A1 | 7/2006 | Miyahara |
| 2007/0108466 A1* | 5/2007 | Kryliouk ........... H01L 21/02658 257/E21.127 |
| 2007/0178306 A1* | 8/2007 | Lal ....................... C09K 11/565 428/402 |
| 2008/0050857 A1* | 2/2008 | Wu ................... H01L 21/02628 438/479 |
| 2013/0192986 A1 | 8/2013 | Morimoto et al. |
| 2013/0273346 A1 | 10/2013 | Mesuda et al. |

FOREIGN PATENT DOCUMENTS

| CN | 103270000 A | 8/2013 |
| JP | 1999-172424 A | 6/1999 |
| JP | 2002-003297 A | 1/2002 |
| JP | 2004-111883 A | 4/2004 |
| JP | 2005-508822 A | 4/2005 |
| JP | 2006-290729 A | 10/2006 |
| JP | 2012-144424 A | 8/2012 |
| JP | 2012-144805 A | 8/2012 |
| JP | 2013-129568 A | 7/2013 |
| JP | 2014-091851 A | 5/2014 |
| JP | 2014-159368 A | 9/2014 |
| WO | WO 2004/022812 A1 | 3/2004 |
| WO | WO 2016/009577 A1 | 1/2016 |

OTHER PUBLICATIONS

Farrer et al., "Properties of hexagonal ScN versus wurtzite GaN and InN", Nov. 20, 2002, Physical Review B, vol. 201203(R), pp. 201203-1-201203-4. (Year: 2002).*
Man, et al., "Effects of ZnO buffer layers on the fabrication of GaN films using pulsed laser deposition", May 10, 2007, Journal of Applied Physics, vol. 101, pp. 093519-1-093519-5 (Year: 2007).*
International Search Report dated Jun. 7, 2016, in PCT/JP2016/059341 filed Mar. 24, 2016.
Combined Chinese Office Action dated Jul. 23, 2018 in Chinese Patent Application No. 2016800153220 (with English translation and English translation of Category of Cited Documents), 11 pages.
Office Action dated Feb. 15, 2019 in corresponding Taiwanese Patent Application No. 105109830 (with English Translation), 10 pages.
Chinese Office Action dated Apr. 10, 2019 in Chinese Patent Application No. 201680015322.0 (with English translation), 9 pages.
Office Action dated Dec. 24, 2019, in Japanese Patent Application No. 2016-021081, filed Feb. 5, 2016 (with English Translation).

\* cited by examiner

*Primary Examiner* — Seth Dumbris
(74) *Attorney, Agent, or Firm* — Oblon, McClelland, Maier & Neustadt, L.L.P.

(57) ABSTRACT

A sputtering target for a gallium nitride thin film, which has a low oxygen content, a high density and a low resistivity. A gallium nitride powder having powder physical properties of a low oxygen content and a high bulk density is used and hot pressing is conducted at high temperature in high vacuum to prepare a gallium nitride sintered body having a low oxygen content, a high density and a low resistivity.

13 Claims, No Drawings

GALLIUM NITRIDE-BASED SINTERED COMPACT AND METHOD FOR MANUFACTURING SAME

CROSS-REFERENCE TO RELATED APPLICATIONS

The present application is a continuation of U.S. application Ser. No. 15/562,112, filed Sep. 27, 2017, which is the National Stage of the International Patent Application No. PCT/JP2016/059341, filed Mar. 24, 2016, which is based on and claims priority to Japanese Application No. 2015-069913, filed Mar. 30, 2015, Japanese Application No. 2015-089571, filed Apr. 24, 2015, Japanese Application No. 2015-150959, filed Jul. 30, 2015, and Japanese Application No. 2015-152855, filed Jul. 31, 2015. The entire contents of these applications are incorporated herein by reference.

TECHNICAL FIELD

Gallium nitride is used as a material of a light-emitting layer of a blue light-emitting diode (LED) or a blue laser diode (LD) and attracts attention also as a material of a power device. A gallium nitride thin film can be formed by a metal organic chemical vapor deposition (MOCVD) method or a sputtering method.

Heretofore, to form a gallium nitride thin film by a sputtering method, a metal gallium target has been used (Patent Document 1). However, in the case of using a metal gallium target, metal gallium melts at the time of sputtering since it has a melting point of about 29.8° C., and a gallium nitride film having properties such as crystallinity and transparency highly stabilized can hardly be obtained.

Further, a high density gallium nitride sintered body has been proposed (Patent Document 2), however, according to Examples of this Patent Document, the sintered body is densified under a very high pressure of 58 Kbar (5.8 GPa), and an apparatus which applies such a pressure is very expensive and a large-sized sintered body cannot be prepared, and since a large-sized sintered body can hardly be prepared, the obtainable film tends to be inferior in the homogeneity.

Further, to reduce the amount of oxygen contained, a method of nitriding a gallium nitride sintered body containing oxygen to reduce the amount of oxygen has been proposed (Patent Document 3). However, if a certain or larger amount of oxygen is reduced, the sintered body may have a fracture.

Further, in the case of employing a DC sputtering method, since a low resistivity of a sputtering target is required, a method of infiltrate a gallium nitride formed product with metal gallium to reduce the resistivity of a sputtering target has been proposed (Patent Document 4). However, by such a method, although the resistivity is decreased, the metal gallium is deposited during bonding or during sputtering, and the deposited metal gallium reacts with a solder material such as indium, thus leading to peeling of the gallium nitride formed product, whereby discharge cannot stably be conducted. To overcome such a problem, a method of lining the gallium nitride formed product with a tungsten thin film to prevent deposition of the metal gallium has been proposed (Patent Document 5), however, the number of target preparation steps increases and the method becomes complicated, and it is necessary to use a special material i.e. an expensive tungsten material.

Further, a GaN single crystal thin film exhibits high performance properties which cannot be achieved by a polycrystalline thin film. A single crystal thin film is commonly formed by epitaxial growth using a single crystal substrate.

To form a thin film on a Si single crystal substrate, a method of interposing a buffer layer is mentioned, and a method of using a metal sulfide thin film as a buffer layer has been proposed (Patent Document 6). The Gibbs energy of formation for forming a Si sulfide is relatively small, and when the lattice constant of the sulfide is close to that of Si, it is possible to form the sulfide by epitaxial growth without forming an amorphous layer at the buffer layer/Si interface.

Further, a method of laminating an aluminum nitride layer on a metal sulfide layer to form a high quality gallium nitride thin film has been proposed (Patent Document 7), however, the lattice strain between aluminum nitride and gallium nitride is about 2.4% in the a-axis direction and about 4% in the c-axis direction, and a further improvement in the strain has been desired so as to further increase the crystallinity.

PRIOR ART DOCUMENTS

Patent Documents

Patent Document 1: JP-A-11-172424
Patent Document 2: JP-A-2005-508822
Patent Document 3: JP-A-2012-144424
Patent Document 4: JP-A-2014-159368
Patent Document 5: JP-A-2014-91851
Patent Document 6: JP-A-2002-3297
Patent Document 7: JP-A-2004-111883

DISCLOSURE OF INVENTION

Technical Problem

It is an object of the present invention to provide a gallium nitride-based sintered body which has a low oxygen content, a high density and a low resistivity, and on which deposition of metal gallium will hardly occur, and a method for producing it.

Solution to Problem

Under these circumstances, the present inventors have conducted extensive studies. As a result, they have found that a gallium nitride-based sintered body which has a low oxygen content, a high density and a low resistivity can be prepared by using a gallium nitride powder which has powder physical properties of a low oxygen content and a high bulk density and by conducting hot pressing in high vacuum at high temperature, and further, an electrically conductive gallium nitride-based sputtering target can be prepared without lining with a special material, and accomplished the present invention.

That is, the present invention provides the following.
(1) A gallium nitride-based sintered body, which has an oxygen content of at most 1 atm % and a resistivity of at most $1 \times 10^2$ Ω·cm.
(2) The gallium nitride-based sintered body according to (1), which has a density of at least 3.0 g/cm$^3$ and at most 5.4 g/cm$^3$.
(3) The gallium nitride-based sintered body according to (1) or (2), which has an average particle size of at least 0.5 μm and at most 3 μm.
(4) The gallium nitride-based sintered body according to any one of (1) to (3), which has a weight of at least 10 g.

(5) The gallium nitride-based sintered body according to any one of (1) to (4), characterized in that even when it is heat-treated in the air at 250° C. for one hour, deposition of metal gallium from a target member cannot be visually confirmed.

(6) A method for producing a gallium nitride-based sintered body by hot pressing, wherein a gallium nitride powder having an oxygen content of at most 2 atm % is used as the raw material, and the gallium nitride powder is heated at a temperature of at least 1,060° C. and less than 1,300° C. with an ultimate vacuum in a chamber of at most 70 Pa at the time of hot pressing.

(7) A gallium nitride sputtering target, which uses the gallium nitride-based sintered body as defined in any one of (1) to (5).

(8) The sputtering target according to (7), wherein no layer containing tungsten is present between a target member and a bonding layer.

(9) The sputtering target according to (7) or (8), wherein the bonding layer contains at least one component among indium, tin and zinc.

(10) A method for producing a gallium nitride-based thin film, which uses the sputtering target as defined in any one of (6) to (9).

Now, the present invention will be described in further detail, however, it should be understood that the present invention is by no means restricted to the following embodiments.

The gallium nitride sintered body of the present invention has an oxygen content of at most 1 atm %, preferably at most 0.5 atm %. By reducing the oxygen content in the sintered body, when the sintered body is used as a sputtering target, inclusion of oxygen as an impurity is reduced at the time of forming a film, and a film with a higher crystallinity can be obtained.

Further, the gallium nitride-based sintered body of the present invention has a resistivity of at most $1\times10^2$ Ωcm, preferably at most $1\times10^1$ Ωcm, further preferably at most $1\times10^0$ Ωcm. With a sintered body having a low resistivity, when used as a sputtering target, not only RF sputtering but also DC sputtering is possible.

The gallium nitride sintered body of the present invention has a density of preferably at least 3.0 g/cm$^3$ and at most 5.4 g/cm$^3$, and the lower limit is more preferably 3.5 g/cm$^3$, further preferably 4.0 g/cm$^3$. The density of the gallium nitride sintered body herein means a density including open pores and means the result of measurement of the bulk density in JIS R1634. Such a gallium nitride-based sintered body can be used as a sputtering target.

The gallium nitride sintered body of the present invention has an average particle size of preferably at least 0.5 μm and at most 3 μm. A sintered body having such a particle size can have a small number of open pores, a low oxygen content and high strength.

Now, the method for producing a gallium nitride sintered body will be described.

As a result of studies of the relation between the specific surface area (BET), the untamped bulk density and the particle size of primary particles of a gallium nitride powder as the raw material, and the strength of the sintered body in detail, it was found that by controlling the above-described physical properties of the gallium nitride powder, inclusion of oxygen as an impurity can be reduced, and a sintered body having a high strength can be obtained.

That is, the method of the present invention is a method for producing a gallium nitride-based sintered body by hot pressing, which comprises using a gallium nitride powder having an oxygen content of at most 2 atm % as the raw material and heating the gallium nitride powder at a temperature of at least 1,060° C. and less than 1,300° C. with an ultimate vacuum in a chamber of at most 70 Pa at the time of hot pressing. By such a production method, even a gallium nitride-based sintered body having a weight of at least 10 g can be produced with high yield.

Now, the production method will be described in further detail.

First, the gallium nitride powder as the raw material is required to have an oxygen content of at most 2 atm %. In order to reduce oxygen, it is necessary to suppress oxidation on the surface, and accordingly the specific surface area of the powder is preferably smaller, and is preferably at most 1.5 m$^2$/g, more preferably less than 0.8 m$^2$/g. By using such a powder, it is possible to reduce the amount of oxygen included from the powder. The lower limit is preferably larger than 0.1 m$^2$/g. If the specific surface area is smaller than 0.1 m$^2$/g, adhesion between particles tends to be low due to a too large particle size, and shape retention tends to be difficult at the time of final firing, and further, firing tends to be difficult since the sintering property generally decreases if the specific surface area is small.

Further, in order to obtain a sintered body having a sufficient strength as a sputtering target, the untamped bulk density of gallium nitride as the raw material is preferably at least 0.8 g/cm$^3$, more preferably at least 1.0 g/cm$^3$. The untamped bulk density is a value obtained by filling a container having a certain volume with a powder without imparting a load such as vibration, and dividing the volume of the powder put by the volume of the container. The untamped bulk density is preferably less than 2.5 g/cm$^3$. If the untamped bulk density is higher than 2.5 g/cm$^3$, the strength of granules constituting the powder tends to be too high, and the granules will remain uncollapsed at the time of molding and firing, and thus the strength of the sintered body will remarkably decrease.

Further, the average particle size of gallium nitride used as the raw material is preferably at least 0.5 μm and at most 3 μm. By using such a powder, it is possible to prepare a sintered body which satisfies both sintering property and low oxygen content. Particularly with respect to gallium nitride, the sintering starting temperature and the decomposition temperature are close to each other, the sintering temperature range is narrow and gallium nitride will not undergo significant grain growth at the time of sintering, and accordingly the distribution of the primary particles before sintering will have significant impact on the sintered body. Here, the particle size of primary particles means a diameter of a particle of the minimum unit observed with a SEM, and the average particle size means a value as the 50% particle size measured by a diameter method with respect to at least 100 particles. In the case of a molded product obtained by using a powder having such an average particle size, the particle size is larger and the adhesion is smaller than ever before, and the bonding strength between particles is relatively weak if open pores are present to such an extent that the molded product can be immersed. Accordingly, if the molded product is immersed with Ga, the molded product may have a fracture due to the stress generated at the time of immersion and a difference in the thermal expansion coefficient by heating and sputtering.

Further, since the semiconductor properties may change by obtaining high crystallinity of a sputtering film and by addition of elements, it is preferred to use a gallium nitride powder containing impurities as little as possible, as the raw material.

As the firing method, hot pressing is employed. Hot pressing is a method to make sintering proceed by imparting a temperature while pressurizing the powder, and is a firing method by which diffusion at the time of firing is assisted by conducting uniaxial pressing at the time of heating, whereby a material which has a low diffusion coefficient and which is hardly sintered can be sintered.

The firing temperature is at least 1,060° C. and less than 1,300° C. A temperature of at least 1,060° C. is required to make sintering of gallium nitride proceed, and the temperature should be less than 1,300° C. so as to suppress decomposition of gallium nitride into nitrogen and metal gallium to a certain amount or lower. Further, in order to improve the density of the sintered body, the pressure at the time of firing is preferably at least 30 MPa and at most 100 MPa, more preferably at least 50 MPa and at most 90 MPa.

Hot pressing is conducted in vacuum. The degree of vacuum at the start of heating is at most 70 Pa, preferably at most 10 Pa, more preferably $10^{-1}$ Pa, particularly preferably at most $10^{-2}$ Pa, whereby oxygen or oxygen element in e.g. water included from the atmosphere can be reduced, and oxidation at the time of firing can be suppressed.

Further, in the case of sintering in vacuum, decomposition of the gallium nitride powder gradually proceeds from around 1,060° C., and by sintering in vacuum, a part of metal gallium which is formed by decomposition will be discharged from the sintered body to the outside together with nitrogen as a gas formed by decomposition. Accordingly, in a hot press mold, clearance between the die and the upper punch is preferably at least 0.2 mm. Otherwise, it is preferred to interpose a material with a low density such as a carbon felt between the powder and the upper and lower punches.

When hot pressing treatment is carried out under the above conditions, metal gallium will not be an inhibitor at the time of sintering and is contained in an appropriate amount, and thus by sintering proceeding, a gallium nitride sintered body which has a high density and of which oxidation is suppressed can be obtained. Particularly in a temperature region of at least 1,060° C. and at most 1,300° C., although metal gallium is partially decomposed, sintering of gallium nitride also proceeds, and accordingly by conducting sintering under pressure in high vacuum, sintering of gallium nitride will proceed without being inhibited by metal gallium, whereby the density will improve. In a case where gallium nitride is used as a sputtering target, the sintered body preferably has electrical conductivity and for that purpose, metal gallium is preferably present. Whether gallium nitride includes metal gallium or not is distinct by confirmation of the resistivity of the sintered body. A substrate, as represented by a gallium nitride single crystal, has a high resistivity, however, the sintered body of the present invention has a low resistivity of at most $10^2$ Ω·cm. A molded product or a sintered body in which decomposition of gallium nitride does not proceed has a high resistivity even when the same material is used. To make metal gallium be included in the gallium nitride sintered body, various methods may be mentioned, and in order to make metal gallium be uniformly present in a small amount, a method of dispersing metal gallium in the gallium nitride raw material powder, or a method of decomposing gallium nitride at the time of sintering so as to form gallium nitride is preferred. By such a method, metal gallium in a small amount can be uniformly dispersed in the sintered body. The content of the metal gallium is preferably less than 30 wt %, more preferably less than 10 wt %.

The obtained sintered body may be processed into predetermined dimensions depending upon the application such as a sputtering target. The processing method is not particularly limited and may, for example, be surface grinding, rotary grinding or cylindrical grinding.

The gallium nitride sintered body may be fixed (bonded) to a support in a flat plate shape or in a cylindrical shape by an adhesive such as a solder material as the case requires and used as a sputtering target. As the sputtering target, it is preferred that no layer containing tungsten is present between a target member and a bonding layer. By not using an expensive metal tungsten target, the cost is reduced, and the productivity will improve since a step of forming a tungsten film is unnecessary.

Further, the sputtering target of the present invention preferably employs as a bonding layer a tin-based solder material, an indium-based solder material or a zinc-based solder material. Among them, indium solder is preferred which has particularly high electrical conductivity and thermal conductivity and which is soft and is thereby easily deformed.

Further, for the sputtering target of the present invention, the support is preferably a metal such as Cu, SUS or Ti, which has a high thermal conductivity and high strength. As the shape of the support, it is preferred to use a support in a flat plate shape for forming a molded product in a flat plate shape, and a support in a cylindrical shape for forming a molded product in a cylindrical shape.

Now, the method for producing a sputtering target of the present invention will be described.

The gallium nitride sintered body is bonded to a support via a bonding layer. As the bonding layer, a tin-based solder material, an indium-based solder material, a zinc-based solder material or the like may be used, and in a case where an indium-based solder material is used, so as to improve indium wettability to the gallium nitride sintered body, a layer improving wettability may be formed between the sintered body and the solder material. The material of such a layer is preferably one which is available at a low cost and which has high wettability to indium, for example, a nickel-based or chromium-based material. Such a layer is preferably uniformly formed over the entire interface with the solder material. A method of forming such a barrier layer is not particularly limited, and sputtering, deposition or coating may, for example, be mentioned.

Further, properties of the thin film formed will be described.

The gallium nitride-based film obtained by the method of the present invention has a hexagonal crystal phase. Although gallium nitride may have a cubic crystal phase, etc., the hexagonal crystal structure is most stable as a crystal phase and is most suitable for constituting a semiconductor device.

Further, the gallium nitride-based film of the present invention has an intensity ratio of (002) plane to (101) plane in 2θ/θ measurement by an X-ray diffraction apparatus, I(002)/I(101) of at least 150. I(002)/I(101) is preferably at least 300, more preferably at least 1,000.

Further, the gallium nitride-based film of the present invention has a minimum oxygen content of at most $5\times10^{21}$ atm/cm$^3$. The minimum oxygen content is preferably at most $3\times10^{21}$ atm/cm$^3$, more preferably at most $2\times10^{21}$ atm/cm$^3$. The minimum oxygen content is a minimum value of the oxygen content within 30 nm from the interface at a position assumed to be a substrate, measured in the film depth direction using a SIMS (secondary ion mass spectrometer). By adjusting the minimum oxygen content to be within the above-described range, at the initial stage of crystal growth, oxygen is introduced into the gallium nitride crystals and the lattice constant is changed, whereby the lattice mismatch with the substrate can be reduced, and the crystallinity can thereby be improved.

Further, the gallium nitride-based film obtained by the production method of the present invention has a half value width of the 2θ/θ measurement peak of (002) plane of preferably at most 0.3°, more preferably at most 0.2°, further preferably at most 0.1°. The 2θ/θ measurement peak herein means a value measured by using a conventional apparatus for powder XRD.

Further, the gallium nitride-based film obtained by the production method of the present invention has a half value width of the ω measurement peak of (002) plane of at most 2°, whereby crystals are uniform in the film, and the film has improved performance when used for a device. The half value width is more preferably at most 1°, further preferably at most 0.1°.

Since the ω measurement method is a means to accurately measure the orientation of the crystal axis, it is necessary to use an XRD apparatus with a range of motion in the ω direction on the measurement sample side.

Now, the method for producing a gallium nitride-based film will be described.

In the method for producing a gallium nitride-based film of the present invention, the film is formed preferably by sputtering under a sputtering gas pressure of less than 0.3 Pa.

As the sputtering method, a DC sputtering method, an RF sputtering method, an AC sputtering method, a DC magnetron sputtering method, an RF magnetron sputtering method, an ion beam sputtering method or the like may be properly selected, and among them, preferred is a DC magnetron sputtering method or an RF magnetron sputtering method in that a film can be formed uniformly in a large area at a high speed.

The gas pressure at the time of sputtering is less than 0.3 Pa, preferably at most 0.1 Pa, more preferably at most 0.08 Pa. The lower the gas pressure at the time of sputtering, the more particles discharged from the sputtering target are likely to arrive at the substrate while maintaining a high energy, and the more they are likely to be re-arranged to achieve epitaxial growth.

The degree of vacuum in the film forming apparatus before film forming is preferably at most $3 \times 10^{-5}$ Pa, more preferably at most $1 \times 10^{-5}$ Pa. By achieving a higher degree of vacuum, residual gases are less likely to be included as impurities at the time of film forming, and the crystallinity of the obtainable thin film will improve.

Further, it is preferred to pre-treat the substrate before film forming. By the pre-treatment, the organic matter layer and irregularities on the substrate surface can be removed, and epitaxial growth can be made possible. The pre-treatment method may, for example, be a reverse sputtering treatment, an acid treatment or a UV treatment, and with a view to preventing reattachment of impurities, etc. after the treatment, a reverse sputtering treatment is preferred. Reverse sputtering is a method of cleaning the surface by making plasmatized atoms bombard the substrate side, not the sputtering target side. By employing such a mechanism, the substrate surface is cleaned and the substrate is transferred to a film-forming chamber without being exposed to the outside air, whereby film forming becomes possible while the cleanness on the substrate surface is kept. The reverse sputtering treatment is preferably conducted in a chamber different from the film-forming chamber with a view to preventing impurities formed by the reverse sputtering from being attached to the film-forming chamber.

Further, at the time of film forming, sputtering is carried out preferably in a state where the substrate is heated. By conducting film forming in a state where the substrate is heated, an energy is applied to the sputtered particles, which are thereby in a more stable crystal state, and fractures due to e.g. a difference in the thermal expansion coefficient at the time of a heat treatment at high temperature can be prevented. The substrate heating temperature in the film forming step (hereinafter sometimes referred to as a film forming temperature) is preferably at least 100° C. and at most 800° C., more preferably at least 400° C. and at most 800° C., particularly preferably at least 600° C. and at most 750° C. If it is less than 100° C., the effect to prevent particle migration or fractures at the time of the heat treatment after film forming tends to decrease. Further, if the film forming temperature is higher than 800° C., a sputtering apparatus tends to be extensive, and advantageous achieved by the sputtering method tend to decrease. Film forming is particularly preferably conducted at a temperature of at least 400° C. By conducting film forming at a temperature of at least 400° C., sputtered particles can be arranged with particularly favorable crystallinity. The gas at the time of film forming preferably contains nitrogen, whereby a film with little nitrogen vacancy can be prepared.

The gas used is not particularly limited but is preferably one containing nitrogen as the main component. Argon may be added as the case requires so as to stabilize discharge. The partial pressure of argon to be added may be from about 0.05 to about 1 based on the partial pressure of nitrogen being 1.

As the electric power at the time of discharge, the power density is preferably at most 5 W/cm$^2$, more preferably at most 2.5 W/cm$^2$, further preferably at most 1.5 W/cm$^2$. The lower limit is preferably 0.1 W/cm$^2$, more preferably 0.3 W/cm$^2$. The power density is calculated by dividing the electric power applied at the time of discharge by the area of the sputtering target. If the power density at the time of discharge is higher than 5 W/cm$^2$, since the sputtering target containing gallium nitride as the main component used generally has a low density, coarse polycrystalline particles tend to be separated from the sputtering target by the power applied to the target. If the power density is less than 0.1 W/cm$^2$, the plasma will not be stabilized and discharge tends to be difficult, and the film forming rate will be lowered and the productivity of the film will decrease.

The thickness of the film formed by the sputtering method is preferably at least 30 nm, more preferably at least 50 nm, whereby a thin film having predetermined crystallinity can be obtained. The surface roughness Ra is preferably at most 10 nm, more preferably at most 5 nm. If the surface roughness Ra is larger than 10 nm, the yield tends to decrease when a light-emitting device or a transistor device is formed.

The gallium nitride-based film of the present invention may be suitably used also as a laminated substrate comprising a substrate and a gallium nitride-based film.

Here, as the substrate, a glass substrate of e.g. alkali-free glass or quartz, a polymer film substrate made of a resin, a substrate made of a ceramic or a metal may, for example, be mentioned. Particularly with a view to reducing deterioration of the crystallinity due to lattice mismatch, conventionally employed sapphire or gallium nitride single crystal or silicon single crystal is preferably employed, and sapphire or silicon single crystal is more preferred. With respect to the plane direction, sapphire (001) plane with relatively favorable lattice matching is preferably employed. The plane direction may be tilted as the offset angle.

Such a laminated substrate is suitably used for a semiconductor device constituted with a plurality of functional members. For example, it is used for e.g. a light-emitting device such as a LED or a power device such as a laser diode or a transistor. Further, such a semiconductor device may be suitably used for various electronic equipment.

Among the laminated substrates, preferred is a laminate containing a silicon single crystal layer, a metal sulfide layer and a gallium nitride layer, having the metal sulfide layer present between the silicon single crystal layer and the gallium nitride layer. It is particularly preferred that the metal sulfide layer is laminated on the silicon single crystal layer.

As the silicon single crystal layer, a silicon single crystal substrate is preferably used, and a Si(100) substrate is particularly preferably used. With such a substrate, the device can be prepared at a low cost, and substrates of various sizes can be used as compared with a conventional sapphire substrate or GaN single crystal substrate.

The metal sulfide layer will not be amorphous due to a low reactivity with silicon, and suppresses formation of an amorphous layer by an interface reaction. Further, the metal sulfide layer reduces the lattice strain between the substrate and the thin film, and it thereby suppresses the dislocation density. The lattice strain is preferably at most 10%, more preferably at most 5%. The metal in the metal sulfide is not particularly limited so long as the small strain is satisfied, and it is preferred to use zinc sulfide, manganese sulfide (MnS), magnesium sulfide or calcium sulfide, and it is more preferred to use manganese sulfide.

Advantageous Effects of Invention

The gallium nitride sintered body of the present invention has a low oxygen content, a high density and a low resistivity, and deposition of metal gallium hardly occurs on it, and it is thereby suitably used as a sputtering target.

EXAMPLES

Now, the present invention will be described with reference to Examples of the present invention, however, it should be understood that the present invention is by no means restricted thereto.
(Specific Surface Area)
The specific surface area of the powder was measured by Micrometrics Tristar.
(Untamped Bulk Density)
The untamped bulk density was measured by Powder Characteristics Tester PT-N (manufactured by HOSOKAWA MICRON CORPORATION).
(Bulk Density of Sintered Body)
The bulk density of the sintered body was measured in accordance with bulk density measurement in JIS R1634.
(Oxygen Content)
The oxygen content of the sintered body was measured by oxygen/nitrogen analysis apparatus (manufactured by LECO JAPAN CORPORATION.
(Heating Test)
The sintered body was heat-treated using a hot plate at 250° C. in the air for one hour, and whether metal gallium was deposited from the sintered body or not was visually confirmed.

(Measurement of Particle Size)
With respect to the particle sizes of the powder and the sintered body, the particle sizes of at least 100 particles were measured from at least two fields of view by the diameter method from images observed with a SEM, and the 50% particle size was taken as the average particle size.
(Confirmation of Crystal Plane, Method of Measuring Half Value Width and Intensity Ratio)
For usual measurement, a common powder X-ray diffraction apparatus (apparatus name: Ultima III, manufactured by Rigaku Corporation) was used. Conditions of the XRD measurement are as follows.
Light source: CuKα ray (λ=0.15418 nm)
Measurement mode: 2θ/θ scan
Measurement interval: 0.01°
Divergence slit: 0.5 deg
Scattering slit: 0.5 deg
Receiving slit: 0.3 mm
Measurement time: 1.0 second
Measurement range: 2θ=20° to 80°
To identify the XRD pattern, a XRD analysis software (product name: JADE7, manufactured by Materials Data Incorporated) was used. With respect to the hexagonal crystal, a gallium nitride crystal plane was confirmed with reference to JCPDS No. 00-050-0792, the half value width was measured with respect to the (002) plane, and the intensity ratio is calculated from the following formula with respect to I(002) and I(101).
Intensity ratio=I(002)/I(101)
In a case where a peak considered to be attributable to the (101) plane is not detected, the background peak intensity at 36 to 37° is regarded as I(101) for calculation.

For high precision measurement, using an XRD apparatus (manufactured by Bruker Corporation, D8 DISCOVER), CuKα2 was removed, and ω scanning was conducted, under conditions of 40 kV and 40 mA, high resolution mode, using Ge(220) monochrometer.
Light source: CuKα ray (λ=0.15418 nm)
Monochrometer: Ge(220)
Path finder: Crystal 3B
Measurement mode: ω scan
Measurement interval: 0.01°
(0.0005° in a case where the half value width is at most 0.1°)
Measurement time: 0.5 second
Measurement range: ω=0° to 35°
(Measurement of Oxygen Content in Film)
The oxygen content in the film was measured by a SIMS (secondary ion mass spectrometer). The content of oxygen was measured in the film depth direction, and the minimum content from 5 nm to 30 nm from the interface at a position assumed to be a substrate was calculated.

Examples 1 to 4

30 g of a gallium nitride powder as identified in Table 1 was cast in a carbon mold of 52 mm in diameter, and the mold was put in a hot press. Firing was started with an ultimate vacuum as identified in Table 1 before the start of temperature increase, the temperature was increased at 200° C./h finally to the temperature as identified in Table 1, and on that occasion, the pressure was elevated to the pressure as identified in Table 1 when the maximum temperature was held, and hot pressing was conducted while the temperature and the pressure were maintained for one hour. The temperature was decreased to about 50° C. over a period of 5 hours, the mold was taken out, and the sintered body was recovered. The sintered body of at least 10 g was obtained in each Example. Of the obtained polycrystalline gallium nitride sintered body, the weight, the density, the oxygen content, the resistivity, the average particle size and the results of the heating test are shown in Table 2.

The sintered body was further processed and bonded to a backing plate, and whether it could be used as a sputtering target to form a film by DC or RF was confirmed. As a result, all the samples could be bonded without any problem and could be used for forming a film by DC/RF.

Example 5

250 g of a gallium nitride powder as identified in Table 1 was cast in a carbon mold of 130 mm in diameter, and the mold was put in a hot press. Firing was started with an ultimate vacuum before the start of temperature increase as identified in Table 1, the temperature was increased at 200° C./h finally to the temperature as identified in Table 1, and on that occasion, the pressure was elevated to the pressure as identified in Table 1 when the maximum temperature was held, and hot pressing was conducted while the temperature and the pressure were maintained for 2 hours. After the temperature was decreased, the mold was taken out, and the sintered body was recovered. Of the obtained polycrystalline gallium nitride sintered body, the weight, the density, the oxygen content, the resistivity, the average particle size and the results of the heating test are shown in Table 2.

Comparative Examples 1 to 3

Using the gallium nitride powder as identified in Table 1, hot pressing was conducted under the same temperature-increasing rate, retention time and temperature-decreasing conditions as in Example 1 except for the ultimate vacuum, the firing temperature and the load as identified in Table 1, whereupon the weight, the density, the oxygen content, the resistivity, the average particle size and the results of the heating test of the obtained polycrystalline gallium nitride sintered body were as identified in Table 2. In Comparative Example 2, shape retaining was not possible, and no sintered body could be obtained.

Comparative Example 4

24.5 g of a gallium nitride sintered body prepared in the same manner as in Comparative Example 1, and metal gallium (purity: 6N, oxygen content: 0.0174 atm %, manufactured by DOWA Electronics Materials Co, Ltd.) in an amount of 1.35 times the amount of the sintered body, were charged in a vacuum packaging bag and vacuumized under 1,000 Pa. The packaging bag was heated to about 50° C. to completely melt metal gallium, and charged to CIP and pressurized under 100 MPa for 60 seconds. The mixture was taken out and heated at about 50° C., remaining metal gallium was removed, and a gallium nitride sintered body infiltrated with metal gallium was obtained. The obtained sintered body was subjected to the heating test at 250° C., whereupon deposition of Ga metal was observed. The average particle size shown in Table 2 is the average particle size of the sintered body before infiltration with metal gallium, and the weight, the density, the oxygen content, the resistivity and the results of the heating test were those of the gallium nitride sintered body infiltrated with metal gallium.

Reference Example

It was attempted to prepare a sintered body infiltrated with metal gallium in the same manner as in Comparative Example 4 using the sintered body prepared in the same manner as in Example 1, however, the sintered body had fractures at the time of infiltration.

TABLE 1

| Examples | Physical properties of powder | | | | Hot pressing conditions | | | | |
|---|---|---|---|---|---|---|---|---|---|
| | Specific surface area m²/g | Oxygen content atm % | Bulk density g/cm³ | Average particle size μm | Mold diameter mmφ | Ultimate vacuum Pa | Firing atmosphere | Temperature ° C. | Load MPa |
| Ex. 1 | 0.5 | 0.7 | 1 | 0.8 | 52 | 50 | Vacuum | 1060 | 50 |
| Ex. 2 | 0.3 | 0.5 | 1.2 | 0.87 | 52 | 0.005 | Vacuum | 1100 | 50 |
| Ex. 3 | 0.3 | 0.5 | 1.2 | 0.87 | 52 | 0.004 | Vacuum | 1150 | 50 |
| Ex. 4 | 0.3 | 0.5 | 1.2 | 0.87 | 52 | 0.003 | Vacuum | 1100 | 100 |
| Ex. 5 | 0.3 | 0.5 | 1.2 | 0.87 | 130 | 0.1 | Vacuum | 1100 | 40 |
| Comp. Ex. 1 | 3.4 | 3.1 | 0.9 | 0.1 | 130 | 50 | Vacuum | 1100 | 50 |
| Comp. Ex. 2 | 0.3 | 0.5 | 1.2 | 0.87 | 52 | 0.004 | Vacuum | 1000 | 50 |
| Comp. Ex. 3 | 3.4 | 3.1 | 0.4 | 0.1 | 52 | 50 | Vacuum | 900 | 50 |
| Comp. Ex. 4 | 3.4 | 3.1 | 0.9 | 0.1 | 52 | 50 | Vacuum | 1000 | 50 |

TABLE 2

| Examples | Physical properties of sintered body | | | | | Ga deposition after heat treatment at 250° C. | Discharge method |
|---|---|---|---|---|---|---|---|
| | Weight g | Density g/cm³ | Oxygen content atm % | Resistivity Ωcm | Average particle size D50 μm | | |
| Ex. 1 | 27.9 | 3.2 | 0.9 | 0.03 | 1 | Nil | DC/RF |
| Ex. 2 | 24.9 | 4.2 | 0.5 | 0.007 | 1.1 | Nil | DC/RF |
| Ex. 3 | 14.1 | 4.5 | 0.3 | 0.002 | 1.3 | Nil | DC/RF |
| Ex. 4 | 23.7 | 4.8 | 0.4 | 0.001 | 1.4 | Nil | DC/RF |
| Ex. 5 | 243 | 3.5 | 0.4 | 0.01 | 1.2 | Nil | DC/RF |

TABLE 2-continued

| | Physical properties of sintered body | | | | | | |
|---|---|---|---|---|---|---|---|
| Examples | Weight g | Density g/cm³ | Oxygen content atm % | Resistivity Ωcm | Average particle size D50 μm | Ga deposition after heat treatment at 250° C. | Discharge method |
| Comp. Ex. 1 | 240 | 3.2 | 3.6 | $4 \times 10^5$ | 0.2 | Nil | RF |
| Comp. Ex. 2 | — | — | — | — | — | — | — |
| Comp. Ex. 3 | 29.4 | 2.5 | 3.8 | $2 \times 10^6$ | 0.3 | Nil | RF |
| Comp. Ex. 4 | 39 | 5.1 | 3.8 | 0.006 | 0.1 | Observed | — |

Reference Examples 1 to 23

A film forming test by sputtering was conducted by using the gallium nitride sputtering target by a magnetron sputtering apparatus under conditions as identified in Table 3.

As a result of film forming under the above conditions, a gallium nitride thin film as identified in Table 4 was obtained.

TABLE 3

| | | Physical properties of target | | | Film | | Discharge Gas introduced | | | | | |
|---|---|---|---|---|---|---|---|---|---|---|---|---|
| Ex. | Discharge method | Material | Oxygen content atm % | Size mmφ | Ultimate vacuum $10^{-6}$ Pa | forming pressure Pa | Nitrogen sccm | Argon sccm | electric power W | Discharge density W/cm² | Film forming temperature ° C. | Film thickness nm |
| Ref. Ex. 1 | RF | GaN | 3 | 120 | 5.8 | 0.07 | 20 | 0 | 125 | 1.1 | 25 | 50 |
| Ref. Ex. 2 | RF | GaN | 3 | 120 | 4.7 | 0.1 | 20 | 0 | 250 | 2.2 | 200 | 50 |
| Ref. Ex. 3 | RF | GaN | 3 | 120 | 6.1 | 0.07 | 20 | 0 | 125 | 1.1 | 25 | 300 |
| Ref. Ex. 4 | RF | GaN | 3 | 120 | 8.5 | 0.07 | 20 | 0 | 125 | 1.1 | 600 | 300 |
| Ref. Ex. 5 | RF | GaN | 3 | 120 | 23 | 0.07 | 20 | 0 | 125 | 1.1 | 800 | 1000 |
| Ref. Ex. 6 | RF | GaN | 3 | 120 | 4.8 | 0.07 | 18 | 0 | 250 | 2.2 | 25 | 300 |
| Ref. Ex. 7 | RF | GaN | 3 | 120 | 6.8 | 0.05 | 10 | 1 | 250 | 2.2 | 25 | 50 |
| Ref. Ex. 8 | RF | GaN | 3 | 120 | 5.8 | 0.07 | 20 | 2 | 250 | 2.2 | 25 | 50 |
| Ref. Ex. 9 | RF | GaN | 3 | 120 | 5.8 | 0.07 | 20 | 0 | 75 | 0.67 | 25 | 50 |
| Ref. Ex. 10 | RF | GaN | 0.4 | 120 | 3.3 | 0.07 | 18 | 0 | 125 | 1.1 | 25 | 300 |
| Ref. Ex. 11 | RF | GaN | 0.4 | 120 | 7.4 | 0.07 | 18 | 0 | 125 | 1.1 | 300 | 300 |
| Ref. Ex. 12 | RF | GaN | 0.4 | 120 | 12 | 0.07 | 18 | 0 | 125 | 1.1 | 400 | 300 |
| Ref. Ex. 13 | RF | GaN | 0.4 | 120 | 4.7 | 0.07 | 18 | 0 | 125 | 1.1 | 600 | 300 |
| Ref. Ex. 14 | RF | GaN | 0.4 | 120 | 6 | 0.07 | 18 | 0 | 125 | 1.1 | 700 | 300 |
| Ref. Ex. 15 | RF | GaN | 0.4 | 120 | 13 | 0.07 | 18 | 0 | 125 | 1.1 | 800 | 300 |
| Ref. Ex. 16 | RF | GaN | 0.4 | 120 | 19 | 0.15 | 30 | 0 | 125 | 1.1 | 700 | 300 |
| Ref. Ex. 17 | RF | GaN | 0.4 | 120 | 2.8 | 0.2 | 30 | 0 | 125 | 1.1 | 700 | 300 |
| Ref. Ex. 18 | RF | GaN | 3 | 76 | 400 | 1.5 | 22 | 0 | 100 | 2.2 | 25 | 1000 |
| Ref. Ex. 19 | RF | GaN | 3 | 76 | 400 | 0.3 | 22 | 0 | 100 | 2.2 | 25 | 1000 |
| Ref. Ex. 20 | RF | GaN | 3 | 120 | 21 | 0.3 | 30 | 0 | 250 | 2.2 | 25 | 1000 |
| Ref. Ex. 21 | RF | GaN | 3 | 120 | 42 | 0.3 | 30 | 0 | 250 | 2.2 | 800 | 1000 |

TABLE 3-continued

| | | Physical properties of target | | | Film | | Gas introduced | | Discharge electric | | Film forming | Film |
|---|---|---|---|---|---|---|---|---|---|---|---|---|
| Ex. | Discharge method | Material | Oxygen content atm % | Size mmφ | Ultimate vacuum $10^{-6}$ Pa | forming pressure Pa | Nitrogen sccm | Argon sccm | power W | Discharge density W/cm² | temperature ° C. | thickness nm |
| Ref. Ex. 22 | RF | GaN | 20 | 120 | 74 | 0.07 | 30 | 0 | 250 | 2.2 | 25 | 300 |
| Ref. Ex. 23 | RF | GaN | 30 | 120 | 21 | 0.07 | 30 | 0 | 250 | 2.2 | 25 | 300 |

TABLE 4

| Examples | Crystal system | Peak intensity ratio | (002) plane half value width ° | 5 to 30 nm oxygen content $10^{20}$ atm/cm³ | ω scanning (002) plane half value width ° |
|---|---|---|---|---|---|
| Ref. Ex. 1 | Hexagonal | 1600 | 0.26 | 25 | — |
| Ref. Ex. 2 | Hexagonal | 1300 | 0.22 | 30 | — |
| Ref. Ex. 3 | Hexagonal | 760 | 0.14 | 20 | 1.47 |
| Ref. Ex. 4 | Hexagonal | 7000 | 0.12 | 20 | 0.6 |
| Ref. Ex. 5 | Hexagonal | 680 | 0.13 | 20 | 0.84 |
| Ref. Ex. 6 | Hexagonal | 830 | 0.15 | 30 | 1.12 |
| Ref. Ex. 7 | Hexagonal | 630 | 0.27 | 30 | — |
| Ref. Ex. 8 | Hexagonal | 1100 | 0.22 | 20 | — |
| Ref. Ex. 9 | Hexagonal | 840 | 0.27 | 22 | — |
| Ref. Ex. 10 | Hexagonal | 2100 | 0.11 | 2.4 | 1.46 |
| Ref. Ex. 11 | Hexagonal | 1240 | 0.11 | 2.7 | 1.28 |
| Ref. Ex. 12 | Hexagonal | 3420 | 0.11 | 2.6 | 0.009 |
| Ref. Ex. 13 | Hexagonal | 2220 | 0.1 | 2.4 | 0.0064 |
| Ref. Ex. 14 | Hexagonal | 2530 | 0.1 | 2.4 | 0.0009 |
| Ref. Ex. 15 | Hexagonal | 2630 | 0.11 | 2.3 | 0.0051 |
| Ref. Ex. 16 | Hexagonal | 2645 | 0.101 | 2.3 | 0.014 |
| Ref. Ex. 17 | Hexagonal | 3922 | 0.092 | 2.4 | 0.005 |
| Ref. Ex. 18 | Hexagonal | | 0.39 | 1.3 | 250 | 6 |
| Ref. Ex. 19 | Hexagonal | 20 | 0.33 | 200 | 21 |
| Ref. Ex. 20 | Hexagonal | 1.6 | 0.3 | 60 | — |
| Ref. Ex. 21 | Hexagonal | 6.8 | 0.18 | 60 | — |
| Ref. Ex. 22 | Hexagonal | 21 | 0.85 | 70 | 3.7 |
| Ref. Ex. 23 | Hexagonal | 9.5 | 1 | 100 | 15.9 |

Now, measurement examples regarding a laminated film are presented. Various measurement methods for evaluation are as follows.
(Method of Measuring Crystal Orientation and Half Value Width)

Scanning was conducted at 2θ/ω using an XRD apparatus, and the crystal orientations of gallium nitride and the metal sulfide were identified from the peak positions and main crystal orientations were confirmed. Among them, the half value width at 2θ/ω with respect to a peak corresponding to gallium nitride (110) plane was measured.
(Method of Confirming Rotational Symmetry)

phi scanning was conducted on the gallium nitride thin film by using an XRD apparatus to confirm the rotational symmetry.
(Method of Measuring Rocking Curve Half Value Width)

ω scanning was conducted on the gallium nitride (110) plane identified by an XRD apparatus to measure the rocking curve half value width.
(Method of Measuring Oxygen Content in Gallium Nitride Thin Film)

Using a SIMS (secondary ion mass spectrometer, apparatus name: PHI ADEPT1010), the amount of oxygen from the interface close to the silicon single crystal layer to 50 nm of the gallium nitride thin film was measured, and the minimum value was taken as the oxygen content. The position of 50 nm from the interface was specified by grasping substances in the respective layers from the compositional change by the SIMS measurement.
(Method of Measuring Surface Roughness)

The surface state was measured within a range of 10 μm square using an AFM apparatus, and the surface roughness with a 10 μm length was measured.

Laminated Film Reference Example 1

A substrate comprising a Si(100) single crystal substrate of 2 inches in diameter and MnS formed in a thickness of 50 nm was used. MnS was confirmed to be oriented in the (100) plane.

Further, a GaN thin film was formed on the MnS/Si thin film under the following conditions to form a laminate.
(Sputtering Conditions)
Discharge method: RF sputtering
Film forming apparatus: magnetron sputtering apparatus
Target size: 2 inches in diameter
Film forming pressure: 1 Pa
Gas introduced: argon+10 vol % nitrogen
Discharge power: 100 W
Substrate temperature: 700° C.
Film thickness: 10 nm
The results of various evaluations were as follows.
Rotational symmetry: four-fold
GaN orientation plane: (110) plane 2θ/ω half value width: 0.7°
Rocking curve half value width: 3.4°
Oxygen content: $3\times10^{21}$ atm/cm$^3$ Laminated Film Reference Example 2

On the GaN layer of the laminate obtained in Laminated Film Reference Example 1, a GaN layer was further formed in a thickness of about 1,000 nm by MOCVD method at a substrate temperature of 1,100° C. The results of various evaluations were as follows.
Rotational symmetry: four-fold
GaN orientation plane: (110) plane
Half value width: 0.18°
Rocking curve half value width: 1.9°
Oxygen content: $1\times10^{21}$ atm/cm$^3$ Laminated Film Reference Example 3

A GaN thin film was formed directly on the Si(100) substrate without forming a MnS buffer layer, however, no dense film could be formed.

The present invention was described in detail with reference to specific embodiments, however, it is obvious for the person skilled in the art that various changes and modifications are possible without departing from the intension and the scope of the present invention.

The entire disclosures of Japanese Patent Application No. 2015-069913 filed on Mar. 30, 2015, Japanese Patent Application No. 2015-089571 filed on Apr. 24, 2015, Japanese Patent Application No. 2015-150959 filed on Jul. 30, 2015 and Japanese Patent Application No. 2015-152855 filed on Jul. 31, 2015 including specifications, claims and summaries are incorporated herein by reference in their entireties.

The invention claimed is:

1. A gallium nitride-based film having an intensity ratio of (002) plane to (101) plane in 2θ/θ measurement by an X-ray diffraction apparatus, I(002)/I(101), of at least 150 and a minimum oxygen content of $5\times10^{21}$ atm/cm$^3$ or less, wherein a surface roughness Ra of the gallium nitride-based film is 10 nm or less.

2. The gallium nitride-based film according to claim 1 having a half value width of the ω measurement peak of (002) plane of 2° or less.

3. The gallium nitride-based film according to claim 1, having a half value width of the 2θ/θ measurement peak of (002) plane of 0.3° or less.

4. The gallium nitride-based film according to claim 1, having a hexagonal crystal phase.

5. A laminated substrate, comprising:
a substrate;
a metal sulfide layer,
wherein the substrate comprises a silicon single crystal layer,
the metal sulfide layer is present between the silicon single crystal layer and the gallium nitride based film, and
a surface roughness Ra of the gallium nitride based film is at most 10 nm,
and
the gallium nitride-based film of claim 1.

6. The laminated substrate according to claim 5, wherein the metal sulfide layer is laminated on the silicon single crystal layer.

7. The laminated substrate according to claim 5, wherein the metal sulfide layer comprises a manganese sulfide layer.

8. The laminated substrate according to claim 5, wherein the silicon single crystal layer comprises a Si(100) substrate.

9. A method for producing the gallium nitride-based film of claim 1, comprising:
forming the gallium nitride-based film by sputtering under a sputtering gas pressure of less than 0.3 Pa.

10. The method according to claim 9, further comprising, before the forming:
setting a degree of vacuum in a film forming apparatus to be at most $3\times10^{-5}$ Pa.

11. The method according to claim 9, wherein the forming includes heating a substrate at a heating temperature of 100° C.-800° C.

12. A semiconductor device, comprising:
the laminated substrate of claim 5.

13. An electronic equipment, comprising:
the laminated substrate of claim 5.

* * * * *